United States Patent
Thomas (10) Patent No.: US 11,515,884 B2
(45) Date of Patent: Nov. 29, 2022

(54) NOISE REDUCING CAPACITANCE DRIVER

(71) Applicant: Analog Devices, Inc., Wilmington, MA (US)

(72) Inventor: Andrew Joseph Thomas, Arlington, MA (US)

(73) Assignee: Analog Devices, Inc., Wilmington, MA (US)

( * ) Notice: Subject to any disclaimer, the term of this patent is extended or adjusted under 35 U.S.C. 154(b) by 56 days.

(21) Appl. No.: 17/230,705

(22) Filed: Apr. 14, 2021

(65) Prior Publication Data

US 2022/0337264 A1 Oct. 20, 2022

(51) Int. Cl.
*H03M 1/12* (2006.01)
*G01R 19/10* (2006.01)
*H03K 5/1252* (2006.01)

(52) U.S. Cl.
CPC ............ *H03M 1/124* (2013.01); *G01R 19/10* (2013.01); *H03K 5/1252* (2013.01)

(58) Field of Classification Search
CPC ........ H03K 5/1252; H03M 1/124; H03F 1/26; G01N 29/26
USPC ....................................................... 327/111
See application file for complete search history.

(56) References Cited

U.S. PATENT DOCUMENTS

| | | | |
|---|---|---|---|
| 4,176,331 A | 11/1979 | Forward et al. | |
| 7,298,151 B2 * | 11/2007 | Kapusta, Jr. | G11C 27/026 324/76.15 |
| 7,710,304 B2 | 5/2010 | Kumamoto et al. | |
| 8,508,257 B2 | 8/2013 | Kapusta et al. | |
| 8,754,973 B2 | 6/2014 | Ikuma et al. | |
| 8,902,093 B1 | 12/2014 | Leuciuc et al. | |

(Continued)

FOREIGN PATENT DOCUMENTS

| | | |
|---|---|---|
| DE | 102016119246 A1 | 4/2017 |
| EP | 1741189 B1 | 2/2013 |

(Continued)

OTHER PUBLICATIONS

Forward, Robert L, et al., "Electronically Cold Microwave Artificial Resistors", IEEE Transactions on Microwave Theory and Techniques, 31(1), (Jan. 1983), 45-50.

(Continued)

*Primary Examiner* — Hai L Nguyen
(74) *Attorney, Agent, or Firm* — Schwegman Lundberg & Woessner, P.A.

(57) ABSTRACT

A circuit having a capacitance driver circuit can allow for reduction of thermal noise to an application circuit. An output of the capacitance driver circuit can drive a capacitor for use by the application circuit coupled to the capacitor at the output of the capacitance driver circuit. The capacitance driver circuit can be structured to operate over a bandwidth of interest. With an input signal, received at the capacitance driver circuit, associated with a target voltage, an output voltage can be provided at the output of the capacitance driver circuit as a bandlimited filtered voltage value of the target voltage, where a root-mean-square voltage deviation of the output voltage from the target voltage, due to thermal noise, is less than a square root of (kT/C). The term k is Boltzmann's constant, T is Kelvin temperature of the capacitance driver circuit, and C is the capacitance of the driven capacitor.

20 Claims, 8 Drawing Sheets

(56) References Cited

U.S. PATENT DOCUMENTS

| | | | |
|---|---|---|---|
| 8,941,438 B2 * | 1/2015 | Kapusta | H03F 3/45475 |
| | | | 330/86 |
| 9,411,987 B2 | 8/2016 | Alladi et al. | |
| 9,525,426 B2 | 12/2016 | Stojanovic et al. | |
| 10,128,859 B1 | 11/2018 | Rajasekhar et al. | |
| 10,460,819 B2 | 10/2019 | Zanbaghi et al. | |

FOREIGN PATENT DOCUMENTS

| | | |
|---|---|---|
| EP | 2192387 B1 | 1/2018 |
| JP | 4216141 B2 | 11/2008 |
| WO | WO-2019171946 A1 | 9/2019 |

OTHER PUBLICATIONS

Kapusta, Ron, et al., "Sampling Circuits That Break the kT/C Thermal Noise Limit", IEEE Journal of Solid-State Circuits, 49(8), (Aug. 2014), 8 pgs.

Servis, Stuart, "Maximize the Performance of Your Sigma-Delta ADC Driver", 5 Making Sense of Sounds, or How AI Can Boost Your Machines' Uptime, 29, (May 2019), 6 pgs.

Walsh, Alan, "Front-End Amplifier and RC Filter Design for a Precision SAR Analog-to-Digital Converter", Analog Dialogue, 46(4)., (Dec. 2012), 5 pgs.

Xie, Steven, "Practical Filter Design Challenges and Considerations for Precision ADCs", Analog Dialogue 50.4, (Apr. 2016), 5 pgs.

* cited by examiner

NOISE REDUCING CAPACITANCE DRIVER

FIELD OF THE DISCLOSURE

This document relates to circuits and in particular to noise reducing capacitor drivers.

BACKGROUND

Analog-to-digital converters (ADCs) often employ a sampling capacitor to sample the input voltage at a requested instant. A dedicated ADC driver circuit, amplifier, or buffer is often used to drive transient currents of this capacitive load. The sampling process also constitutes a portion of the ADC's specified noise, specifically the square root (sqrt) of (kT/C), where C is the capacitance of the sampling capacitor, k is Boltzmann's constant, and T is the Kelvin temperature of the circuit. It has been observed that using a single emitter-follower or a source-follower as a capacitor driver can lower noise to kT/2C or 2 kT/3C, but the extent of the improvement is limited, and these followers may not be useful as general-purpose drivers.

SUMMARY OF THE DISCLOSURE

A circuit having a capacitance driver circuit can allow for reduction of thermal noise to an application circuit. An output of the capacitance driver circuit can drive a capacitor for use by the application circuit coupled to the capacitor at the output of the capacitance driver circuit. The capacitance driver circuit can be structured to operate over a bandwidth of interest. With an input signal, received at the capacitance driver circuit, associated with a target voltage, an output voltage can be provided at the output of the capacitance driver circuit as a bandlimited filtered voltage value of the target voltage, where a root-mean-square voltage deviation of the output voltage from the target voltage, due to thermal noise, is less than a square root of (kT/C). The term k is Boltzmann's constant, T is Kelvin temperature of the capacitance driver circuit, and C is the capacitance of the driven capacitor.

For example, in certain embodiments, a circuit can be provided that discloses: a bandlimited capacitance driver circuit including an input node to receive a signal corresponding to a target voltage and an output node to couple to a capacitor having a capacitance value C, with an output voltage, at the output node, approximating a bandlimited filtered voltage value of the target voltage with a root-mean-square voltage deviation from the target voltage due to thermal noise of less than a square root of kT/C, with k being Boltzmann's constant, and T being Kelvin temperature of the bandlimited capacitance driver circuit.

In certain embodiments, a method of operating a circuit having a capacitance driver circuit can be provided that discloses: receiving a signal at an input node of a bandlimited capacitance driver circuit, the signal corresponding to a target voltage; generating, in response to receiving the signal, an output voltage at an output node of the bandlimited capacitance driver circuit; and coupling the output voltage to a capacitor having a capacitance value C, the output voltage approximating a bandlimited filtered voltage value of the target voltage with a root-mean-square voltage deviation from the target voltage due to thermal noise of less than a square root of kT/C, with k being Boltzmann's constant, and T being Kelvin temperature of the bandlimited capacitance driver circuit.

In certain embodiments, a circuit can be provided that discloses: a means for driving a capacitance including an input node to receive a signal corresponding to a target voltage and an output node to couple to a capacitor having a capacitance value C, with an output voltage, at the output node, approximating a bandlimited filtered voltage value of the target voltage with a root-mean-square voltage deviation from the target voltage due to thermal noise of less than a square root of kT/C, with k being Boltzmann's constant, and T being Kelvin temperature of the bandlimited capacitance driver circuit.

BRIEF DESCRIPTION OF THE DRAWINGS

The drawings, which are not necessarily drawn to scale, illustrate generally, by way of example, but not by way of limitation, various embodiments discussed in the present disclosure.

DETAILED DESCRIPTION

The following are example embodiments of capacitor-driving circuits, in accordance with the teachings herein. In various embodiments, a mechanism of constructing a capacitor-driving circuit that allows sampling with less than an amount of thermal noise equal to the sqrt (kT/C) is provided in which a system signal-to-noise (SNR) can exceed a specification SNR for the system. The system can include an ADC. Embodiments of capacitor-driving circuits, as taught herein, can reduce noise by an arbitrary factor and are more broadly applicable than being applied to an ADC.

Though various mechanisms of architecting an ADC to circumvent kT/C noise are known, for example correlated double sampling, embodiments taught herein differ in that they can be applied to a broad variety of existing ADC architectures and future ADCs independent of architecture.

A capacitance driver circuit, which produces a low pass filter driving a capacitance with less noise than an integrated noise power of kT/C of the capacitance being driven, can be implemented with the capacitance driver circuit using an active circuit as a resistance. The active circuit can be a synthetic admittance circuit, a synthetic impedance circuit, or a combination thereof. By synthetic, it is meant an arrangement of components that behaves similar to or simulates a physical element. With respect to a resistor arranged to couple to a capacitor, a synthetic circuit can be an arrangement of resistors and active circuit elements to operate like the resistor providing the values of parameters of the resistor. The synthetic circuit is an arrangement other than simply a product of the resistors. A synthetic admittance circuit can emulate a resistor that is conventionally used with a sampling capacitor. A driver circuit can be implemented to provide an input to a capacitor of an electronic device such that voltage noise density associated with driving the capacitor is decoupled from the bandwidth associated with driving the capacitor. The capacitor can be a sampling capacitance for the electronic device. The electronic device can be, but is not limited to, an ADC.

Figure 1:
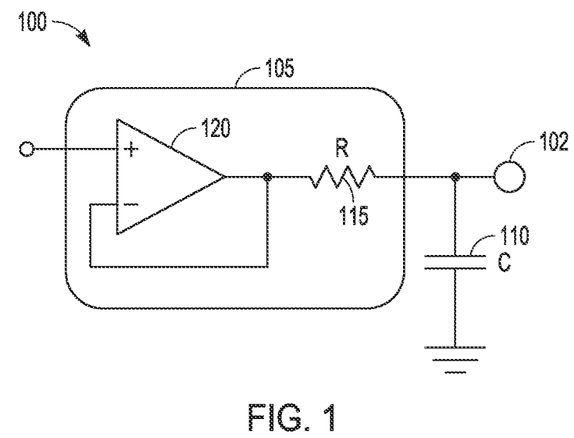
FIG. 1 illustrates an example approach to a circuit having a capacitor-driving circuit coupled to a capacitor, associated with various embodiments.

FIG. 1 illustrates an example approach to a circuit 100 having a capacitor-driving circuit 105 coupled to a capacitor 110 having capacitance C. The capacitor 110 can be coupled to another circuit, for example an ADC. For capacitor 110 being in input of a ADC, the sampled voltage on the capacitor 110 can be provided with the capacitor-driving circuit 105 forming a low-pass filter to the capacitor 110. In other examples, the capacitor 110 can be implemented as part to a circuit coupled to the node 102. The capacitor-driving circuit 105 is structured to function as a buffered resistor with a buffer 120 coupled to a resistor 115 having resistance R, with the resistor 115 coupled to the capacitor 110 at the node 102.

The capacitor 110 can be used as part of the filter provided by the capacitor-driving circuit 105. In the capacitor-driving circuit 105, the voltage noise density $e_n$ and the equivalent noise bandwidth (ENBW) $f_N$, associated with resistance coupled to a capacitor are coupled, where $e_n = \text{sqrt}(4kTR)$ and $f_N = 1/(4RC)$ that results in an integrated noise power equal to $$e_n^2 \cdot f_N = kT/C.$$

A circuit may instead be constructed which provides a similar function to capacitance driver circuit 105 while decoupling the noise density and equivalent noise bandwidth so that the integrated noise power may be less than kT/C.

In various embodiments, a capacitor-driving circuit can be implemented as a bandlimited capacitance driver circuit including an input node to receive a signal corresponding to a target voltage and an output node to couple to a capacitor having a capacitance value C, with an output voltage, at the output node, approximating a bandlimited filtered voltage value of the target voltage with a root-mean-square voltage deviation from the target voltage due to thermal noise of less than a sqrt (kT/C). The bandlimited capacitance driver circuit can be implemented in a number of configurations. For example, the bandlimited capacitance driver circuit can be configured to be responsive to a voltage difference between the output voltage at the output node and a received voltage at the input node or a terminal current at the output node.

Figure 2:
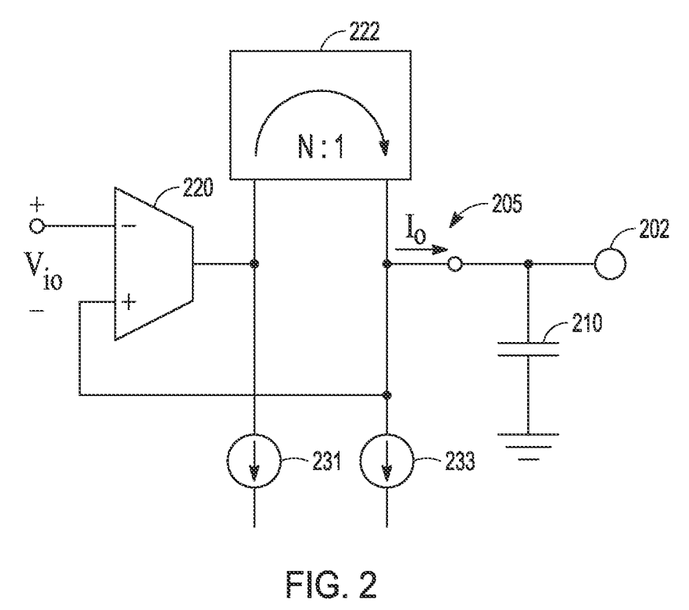
FIG. 2 shows an example admittance circuit having a transconductance amplifier stage and an attenuating current mirror to couple to a capacitor at an output node, according to various embodiments.

A capacitance driver circuit that produces a low pass filter driving a capacitance with less noise than the sqrt (kT/C) of the capacitance being driven can be implemented with the capacitance driver circuit using an active circuit as an equivalent resistance. FIG. 2 shows an embodiment of an example admittance (Y) circuit 205 having a transconductance amplifier stage 220 and a current mirror 222 to couple to a capacitor 210 at an output node 202, with an output voltage approximating a bandlimited filtered voltage value of a target voltage with a root-mean-square voltage deviation from the target voltage, due to thermal noise, being less than a sqrt (k/C). The admittance circuit 205 can be an active circuit providing a synthetic admittance circuit corresponding to the capacitor-driving circuit 105 of FIG. 1, providing an equivalent admittance $Y_{eq}$ to the capacitor 210.

The current mirror 222 of Y-mode circuit 205 can have two nodes and be highly degenerated at a N:1 ratio. The transconductance amplifier stage 220 can have two input nodes and an output node coupled to one of the two nodes of the current mirror 222 and to a current source 231. One of the two input nodes of the transconductance amplifier stage 220 can be coupled to the second one of the two nodes of the current mirror 222, which is a low output of the current mirror 222, and to a current source 233. The two input nodes of the transconductance amplifier stage 220 can be implemented as a differential pair with a voltage difference of $V_{io}$. A current $I_o$, from the second one of the two nodes of the current mirror 222, can be provided to a capacitor 210 at an output node 202 of the admittance circuit 205.

For the structure of Y-mode circuit 205, a V(in, out) relationship can be measured with low $e_n$ by transconductance amplifier 220. An output current I(out) for admittance circuit 205 with an equivalent resistance $R_{eq}$ can be driven with I(out)=V(In, out)/$R_{eq}$ with a low noise current, which can be generally written as $I_o = V_{io} \cdot Y_{eq}(s)$. The noise current may be decoupled from the voltage noise of transconductance amplifier 220 by the attenuation factor N of current mirror 222. For sufficiently large value of N, the admittance circuit 205 can be structured for the total noise current power spectral density (PSD) given by $$i_{n,tot}^2 = \left(\frac{e_n}{R_{eq}}\right)^2 + i_n^2 < \frac{4kT}{R_{eq}},$$

which quantifies low $e_n$ and low in.

Figure 3:
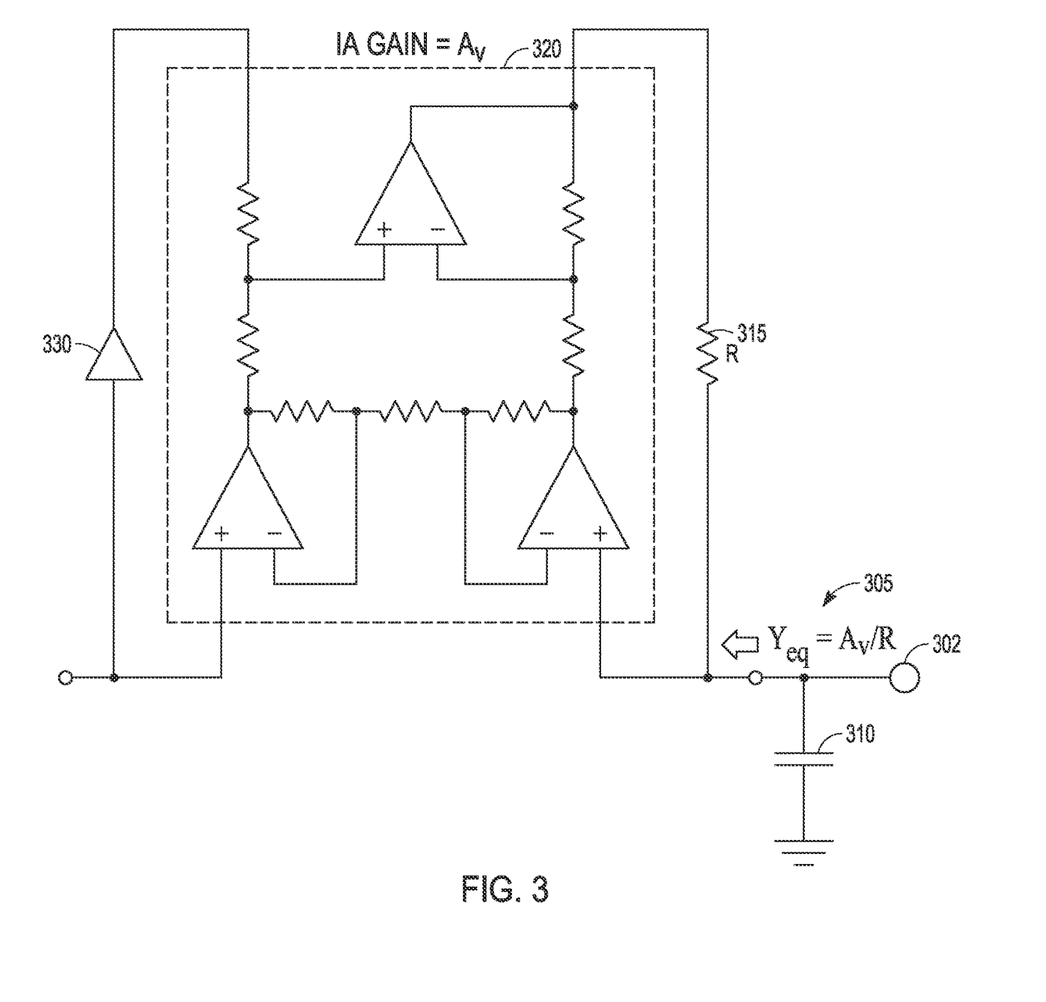
FIG. 3 shows an example admittance circuit structured to provide linearity using an instrumentation amplifier to couple to a capacitor at an output node, according to various embodiments.

FIG. 3 shows an embodiment of an example admittance circuit 305 structured to provide improved linearity using an instrumentation amplifier (IA) 320 to couple to a capacitor 310 at an output node 302, with an output voltage approximating a bandlimited filtered voltage value of a target voltage with a root-mean-square voltage deviation from the target voltage, due to thermal noise, being less than a sqrt (kT/C). The admittance circuit 305 is an active circuit providing a synthetic circuit providing an equivalent admittance $Y_{eq}$ to the capacitor 310. The admittance circuit 305 can include a buffer 330 coupled to the IA 320 and a resistor 315 coupled to the IA 320 and to a capacitor 310 being driven. The coupling of the resistor 315 to the capacitor 310 can be made at an output node 302. The IA 320 has a gain of $A_V$ and the resistor 315 has a resistance of R.

The resistor 315 provides a current to the output node 302. Looking into the admittance circuit 305 from the capacitor 310, the equivalent admittance $Y_{eq}$ is given by $Y_{eq}=A_V/R$. As $A_V$ increases to infinity, the noise spectral density (NSD) at the output 302 approaches the $e_n$ of IA 320. The ENBW of the admittance circuit 305 driving the capacitor is given by ENBW=$Y_{eq}/(4C)$, which is independently controllable by the choice of R of the resistor 315. The buffer 330 can be used to reduce loading of the input without affecting the functionality of the admittance circuit 305.

Figure 4:
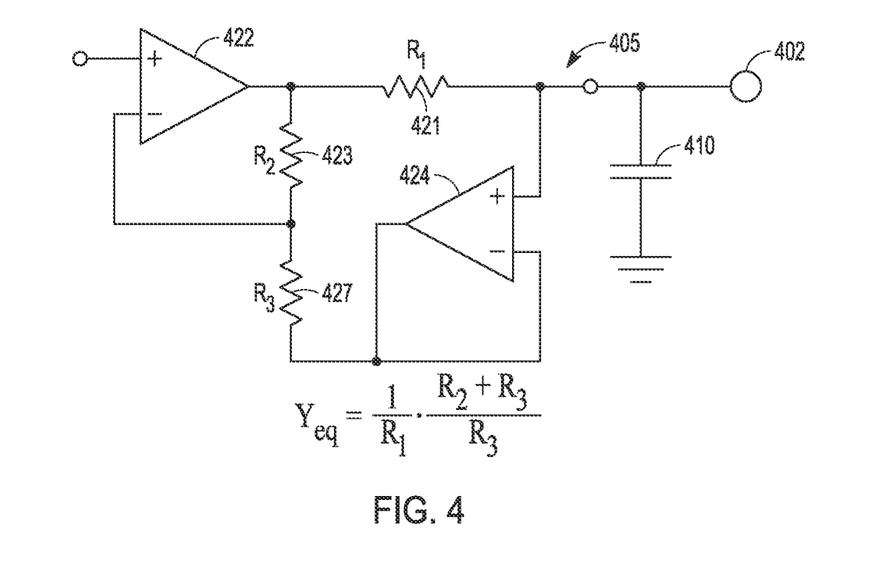
FIG. 4 shows an example admittance circuit structured to provide linearity to drive a capacitor at an output node, according to various embodiments.

FIG. 4 shows an embodiment of an example admittance circuit 405 structured to provide linearity to drive a capacitor 410 at an output node 402, with an output voltage approximating a bandlimited filtered voltage value of a target voltage with a root-mean-square voltage deviation from the target voltage, due to thermal noise, being less than a sqrt (kT/C). The admittance circuit 405 is an active circuit providing a synthetic equivalent admittance $Y_{eq}$ to the capacitor 410. The admittance circuit 405 functions similarly to the admittance circuit 305 of FIG. 3 and can be implemented with fewer components. The admittance circuit 405 can include a first operational amplifier 422, as an input to the admittance circuit 405, with the first operational amplifier 422 having a first input (+polarity) and a second input (−polarity). The output of the first operational amplifier 422 is coupled to a resistor 421, having a value $R_1$, and to a resistor 423, having a value $R_2$, at a common node. The other end of the resistor 423 is coupled to the second input of the first operational amplifier 422. The other end of the resistor 421 is coupled to a first input (+polarity) of a second operational amplifier 424. The output of the second operational amplifier 424 is coupled to a second input (−polarity) of the second operational amplifier 424. The output of the second operational amplifier 424 is also coupled to a resistor 427, having resistance $R_3$, where the other end of the resistor 427 is coupled to the second input of the first operational amplifier 422 and to the resistor 423.

The operational amplifier 424 provides buffered feedback to the operational amplifier 422 from the capacitor 410. Looking into the admittance circuit 405 from the capacitor 410, the equivalent admittance $Y_{eq}$ is given by $Y_{eq}=(1/R_1)\cdot(R_2+R_3)/R_3$.

Figure 5:
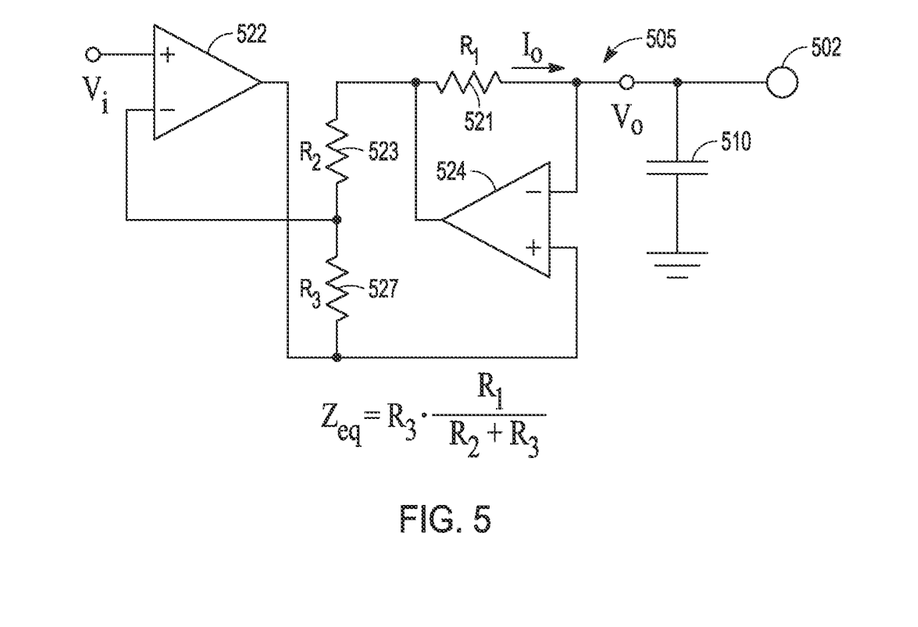
FIG. 5 shows an example impedance circuit structured to drive a capacitor at an output node, according to various embodiments.

FIG. 5 shows an embodiment of an example impedance circuit 505 structured to drive a capacitor 510 at an output node 502, with an output voltage approximating a bandlimited filtered voltage value of a target voltage with a root-mean-square voltage deviation from the target voltage, due to thermal noise, being less than a sqrt (kT/C). The impedance circuit 505 provides a dual or an inverse of using an admittance technique. The impedance circuit 505 is an active circuit providing a synthetic equivalent impedance $Z_{eq}$ to the capacitor 510. A measure of a current I(out) with low in to the capacitor 510 can be provided in impedance circuit 505. The capacitor can be driven with V(out)=V(in)−$R_{eq}\cdot$I(out) with low $e_n$, more generally $V_o=V_i-I_o\cdot Z_{eq}(s)$. Bandwidth and noise density may be separately controlled by choice of resistor values to provide a root-mean-square voltage deviation from the target voltage, due to thermal noise, less than sqrt (kT/C). To attain this condition, the impedance circuit 505 can be structured with noise voltage PSD given by $$(i_n R_{eq})^2 + e_n^2 < 4kTR_{eq},$$

which quantifies low $e_n$ and low $i_n$.

The impedance circuit 505 can include a first operational amplifier 522, as an input to the impedance circuit 505, with the first operational amplifier 522 having a first input (+polarity) and a second input (−polarity). The output of the first operational amplifier 522 is coupled to a resistor 527, having a value $R_3$, and to a first input (+polarity) of a second operational amplifier 524. The other end of the resistor 527 is coupled to the second input (−polarity) of the first operational amplifier 522 and to a resistor 523, having a value $R_2$ at a common node. The other end of the resistor 523 is coupled to the output of the second operational amplifier 524 and to a resistor 521, having a value $R_1$, at a common node. The other end of the resistor 521 is coupled to a second input (−polarity) of the second operational amplifier 524, with the second input of the second operational amplifier 524 coupled to the capacitor 510 at the output node 502. Looking into the impedance circuit 505 from the capacitor 510, the equivalent impedance $Z_{eq}$ is given by $Z_{eq}=(R_3)\cdot R_1/(R_2+R_3)$.

The driver circuits of FIGS. 2-4 provide a current to the capacitor determined by a measured voltage difference between the input and output nodes, forming a synthetic admittance (Y-mode) technique to drive a capacitor with low $e_n$, while the driver circuit of FIG. 5 provides a voltage on the capacitor determined by a measured current into the capacitor, forming a synthetic-impedance (Z-mode) technique to drive a capacitor. The Z-mode technique may have preferable characteristics for operation with respect to components of the driver circuits.

Figure 6:
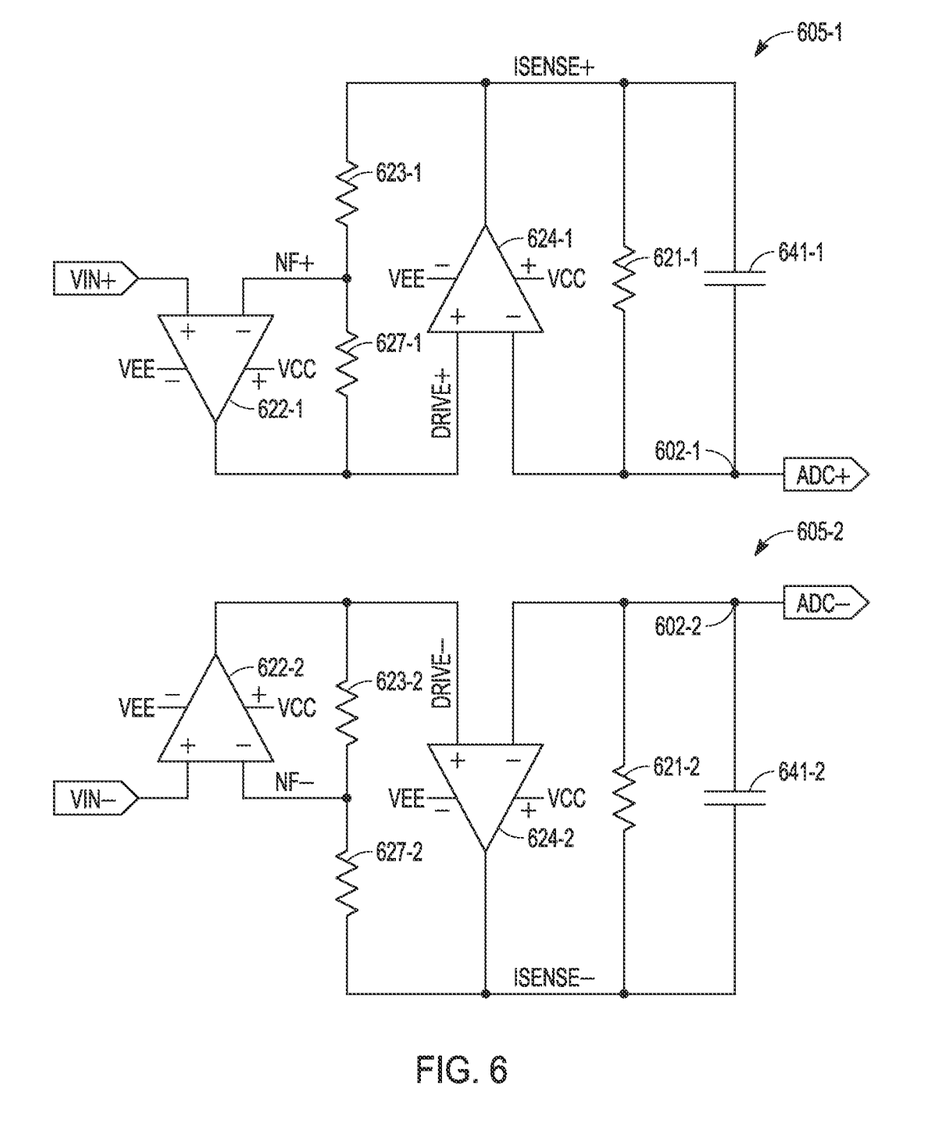
FIG. 6 shows an example differential driver circuit arrangement having two drivers coupled to an analog-to-digital converter module, according to various embodiments.

FIG. 6 shows an embodiment of an example differential driver circuit arrangement having drivers 605-1 and 605-2 to an ADC module having inputs ADC+ and ADC−. The ADC module can be a separate packaged integrated circuit separate from the differential driver circuit arrangement having drivers 605-1 and 605-2. Drivers 605-1 and 605-2 are structured similarly with respect to input nodes $V_{in}+$ and $V_{in}-$. Input node Vin+ to driver 605-1 is coupled to a first input (+polarity) of an operational amplifier 622-1. The output of the operational amplifier 622-1 is coupled to a resistor 627-1. The other end of the resistor 627-1 is coupled to a second input (−polarity) of the operational amplifier 622-1 and one end of a resistor 623-1 at node NF+. The other end of the resistor 623-1 is coupled to the output of an operational amplifier 624-1.

The output of the operational amplifier 622-1 is also coupled to a first input (+polarity) of the operational amplifier 624-1 to provide a drive signal (drive+) to the operational amplifier 624-1. The output of the operational amplifier 624-1 provides feedback to a second input (−polarity) of the operational amplifier 622-1 through the resistor 623-1 and provides a signal (Isense+) to a common node to a resistor 621-1 and a capacitor 641-1, where the other ends of the resistor 621-1 and the capacitor 641-1 are coupled, opposite to the node that receives Isense+, at an output node 602-1 that is coupled to ADC+. The output node 602-1 is coupled to a second input (−polarity) of the operational amplifier 624-1 to provide a feedback signal to compare with drive+ at the operational amplifier 624-1. The operational amplifier 622-1 and the operational amplifier 624-1 are coupled to power sources Vee and Vcc.

Input node $V_{in}-$ to driver 605-2 is coupled to a first input (+polarity) of an operational amplifier 622-2. The output of the operational amplifier 622-2 is coupled to a resistor 623-2. The other end of the resistor 623-2 is coupled to a second input (−polarity) of the operational amplifier 622-2 and one end of a resistor 627-2 at node NF−. The other end of the resistor 627-2 is coupled to the output of an operational amplifier 624-2.

The output of the operational amplifier 622-2 is also coupled to a first input (+polarity) of the operational amplifier 624-2 to provide a drive signal (drive−) to the operational amplifier 624-2. The output of the operational amplifier 624-2 provides feedback to a second input (−polarity) of the operational amplifier 622-2 through the resistor 627-2 and provides a signal (Isense−) to a common node to a resistor 621-2 and a capacitor 641-2, where the other ends of the resistor 621-2 and the capacitor 641-2 are coupled, opposite to the node that receives Isense −, at an output node 602-2 coupled to ADC−. The output node 602-2 is coupled to a second input (−polarity) of the operational amplifier 624-2 to provide a feedback signal to compare with drive— at the operational amplifier 624-2. The operational amplifier 622-2 and the operational amplifier 624-2 are coupled to power sources Vee and Vcc.

The addition of capacitors 641-1 and 641-2 to the differential driver circuit arrangement provided by drivers 605-1 and 605-2, respectively, allows for adjusting the high frequency synthetic impedance Z(s) to address non-idealities of the components. For example, the capacitance values $C_{641-1}$ and $C_{641-2}$ may be selected to have a specific ratio to the loading capacitance on the nodes ADC+ and ADC− (not shown) to substantially eliminate an increase in the high-frequency noise due to characteristics of operational amplifiers 624-1 and 624-2. The resistances in the drivers 605-1 and 605-2 can be sized for negligible noise. Resistors 621-1 and 621-2 can have resistance $R_1$. Resistors 623-1 and 623-2 can have resistance $R_2$. Resistors 627-1 and 627-2 can have resistance $R_3$. The selection of the values of R1, R2, and R3 can be made with respect to $R_{eq}$ associated with FIG. 1 according to:

$$R_1 >> R_{eq}$$

$$R_3 << R_{eq}$$

$$(R_2+R_3)/R_3 >> 1.$$

As a non-limiting example, values of resistors in the drivers 605-1 and 605-2 of FIG. 6 can include $R_1$=49.9 kΩ, $R_2$=1.15 kΩ, and $R_3$=25.5Ω.

In the differential driver circuit arrangement provided by drivers 605-1 and 605-2, the operational amplifiers 622-1 and 622-2 can be selected that have a low $e_n$, are reasonably fast, and are power-efficient. The operational amplifiers 624-1 and 624-2 should have a low $e_n$ and a low in at MHz frequencies, since $i_n R_{eq}$ contributes deviations due to thermal noise. In the selection of operational amplifiers for operational amplifiers 624-1 and 624-2, the integrated noise power of kT/C can be overcome by a factor $\beta_n$=4 kT/($e_n \cdot i_n$), where $e_n$ includes the effects of resistor 627-1 and operational amplifier 622-1 in driver circuit 605-1 and resistor 627-2 and operational amplifier 622-2 in driver circuit 605-2, and in includes the effects of resistor 621-1 in driver circuit 605-1 and resistor 621-2 in driver circuit 605-2. Thus, the factor $\beta_n$ can be used as a figure of merit (FOM) for candidate operational amplifiers 624-1 and 624-2.

In the differential driver circuit arrangement provided by drivers 605-1 and 605-2, optimal noise can occur for $R_{eq}=e_n/i_n$. For use with an ADC, the selection of $R_{eq}$ can include picking $R_{eq}=1/(2\pi f_t C)$, with $f_t$ being a frequency selected to provide adequate acquisition setting.

The differential driver circuit arrangement of FIG. 6 for an ADC module was evaluated in an experimental setup by the inventor. The results included a $R_{eq}$ of 1.1 kΩ and a sampling frequency $f_s$ of 1.3 MHz. The total harmonic distortion (THD) of the ADC module at 1 kHz was unaffected. A SNR that was 0.5 dB better than using a conventional capacitor-driver circuit was attained.

Figure 7:
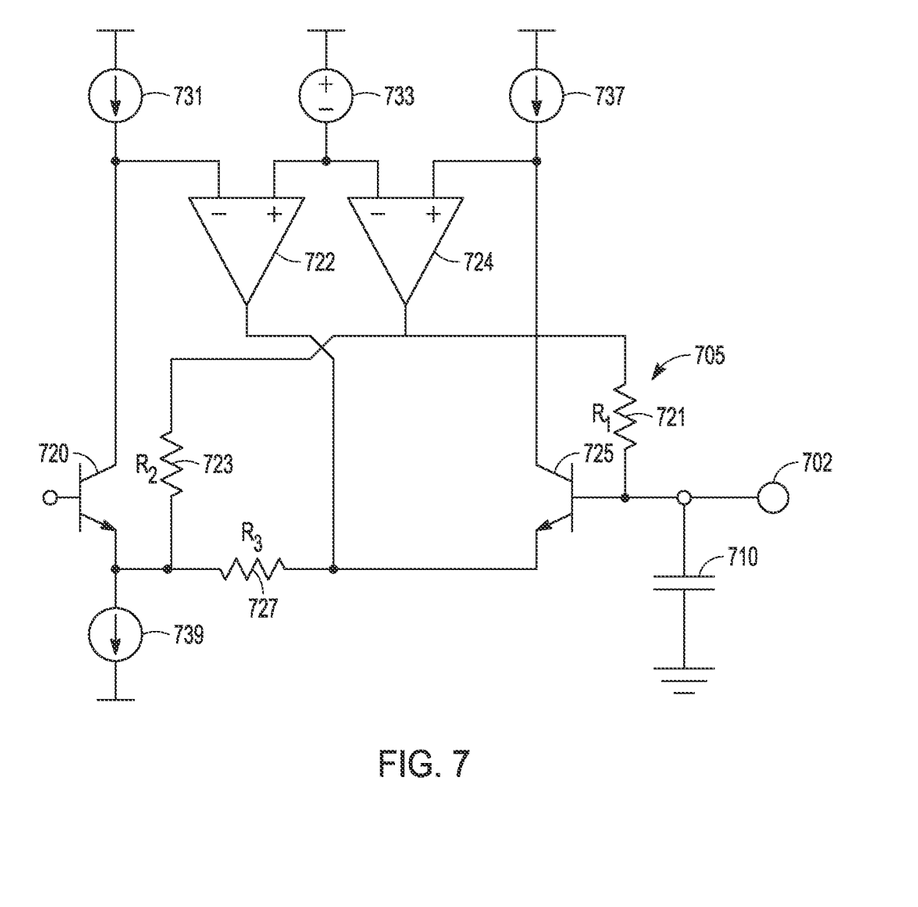
FIG. 7 shows an example driver circuit, using bipolar transistors, structured to drive a capacitor at an output node, according to various embodiments.

FIG. 7 shows an embodiment of an example driver circuit 705, using bipolar transistors, structured to drive a capacitor 710 at an output node 702, with an output voltage approximating a bandlimited filtered voltage value of a target voltage with a root-mean-square voltage deviation from the target voltage, due to thermal noise, being less than a sqrt (kT/C). The driver circuit 705 includes a bipolar transistor 720 at an input of the driver circuit 705 with the input coupled to a base of the bipolar transistor 720, where an emitter of the bipolar transistor 720 is coupled to a current source 739. The emitter of the bipolar transistor 720 is also coupled to a resistor 723 and a resistor 727 at a common node. A collector of the bipolar transistor 720 is coupled to a current source 731 and to a first input (−polarity) of an operational amplifier 722 at a common node. An output of the operational amplifier 722 is coupled to the resistor 727 at an end of the resistor 727 opposite the end of the resistor 727 coupled to the emitter of the bipolar transistor 720. A second input (+polarity) of the operational amplifier 722 is coupled to a voltage source 733 and to a first input (−polarity) of an operational amplifier 724 at a common node. An output of the operational amplifier 724 is coupled to the resistor 723 at an end of the resistor 723 opposite the end of the resistor 723 coupled to the emitter of the bipolar transistor 720. A second input (+polarity) of the operational amplifier 724 is coupled to a current source 737 and to a collector of a bipolar transistor 725. An emitter of the bipolar transistor 725 is coupled to the output of the operational amplifier 722 and to the resistor 727 at an end of the resistor 727 opposite the end of the resistor 727 coupled to the emitter of the bipolar transistor 720. A base of the bipolar transistor 725 is coupled to a resistor 721 and the capacitor 710 at the output 702. An end of the resistor 721, opposite the end of the resistor 721 coupled to the base of the bipolar transistor 725, is coupled to the output of the operational amplifier 724 and to the resistor 723 at an end of the resistor 723 opposite the end of the resistor 723 coupled to the emitter of the bipolar transistor 720.

The bipolar transistor 720 and the bipolar transistor 725 in the driver circuit 705 of FIG. 7 are npn bipolar transistors. The bipolar transistors 720 and 725 can be constructed to have the same structural properties. The driver circuit 705 can have a $\beta_n$ that approaches 2*sqrt($\alpha_{(npn)}$), where $\beta_{(npn)}$ is the current gain of the npn bipolar transistors 720 and 725. The driver circuit 705 can be implemented with pnp bipolar transistors or other types of transistors with appropriate adjustments in polarity of the elements of the driver circuit 705. One or more resistors external to the driver circuit 705 can be used in an optimization process of $R_{eq}$. Such external resistors can be used in other capacitor-driver circuits taught herein.

Figure 8:
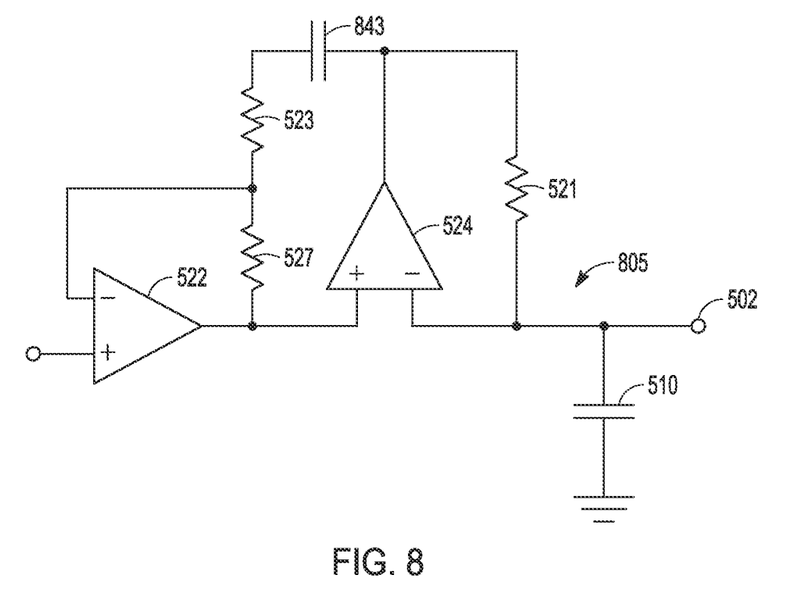
FIG. 8 shows an example impedance circuit structured to drive a capacitor at an output node, according to various embodiments.

Various modifications to a driver circuit to drive a capacitor at an output node can be implemented to provide an output voltage at the capacitor approximating a bandlimited filtered voltage value of a target voltage with a root-mean-square voltage deviation of the output voltage from the target voltage, due to thermal noise, being less than a sqrt (kT/C). FIG. 8 shows an embodiment of an example driver circuit 805 that is a modification of circuit 505 of FIG. 5 by the addition of capacitor 843 to achieve a complex synthetic impedance Z(s) having an inductive character below a given frequency. For example, the complex Z(s) can be inductive below 100 kHz for improved tracking. This inductive characteristic can be attained by structuring the capacitor in series with an output resistor such as the resistors having resistance $R_1$ in the driver circuits 405, 505, 605, and 705 of FIGS. 4-7.

Figure 9:
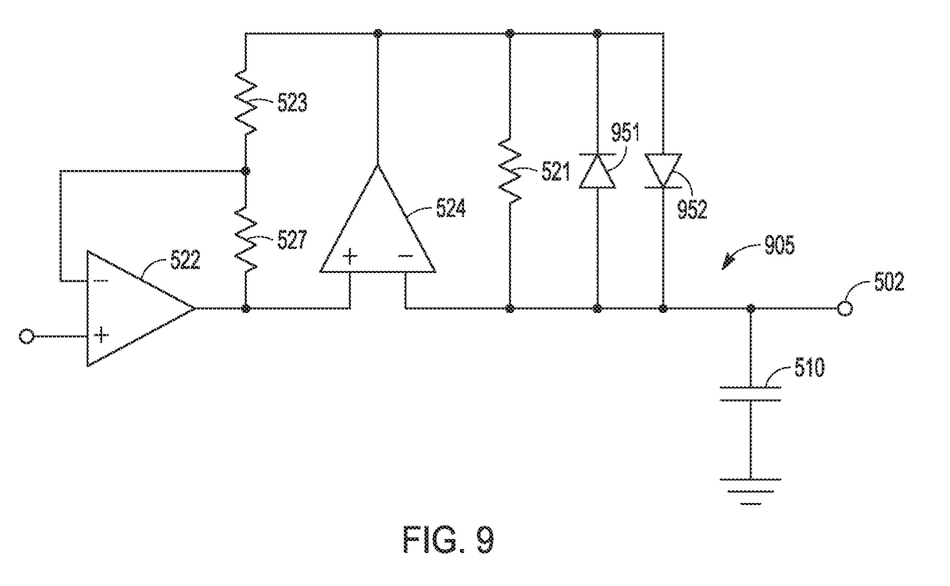
FIG. 9 shows an example impedance circuit structured to drive a capacitor at an output node, according to various embodiments.
Figure 10:
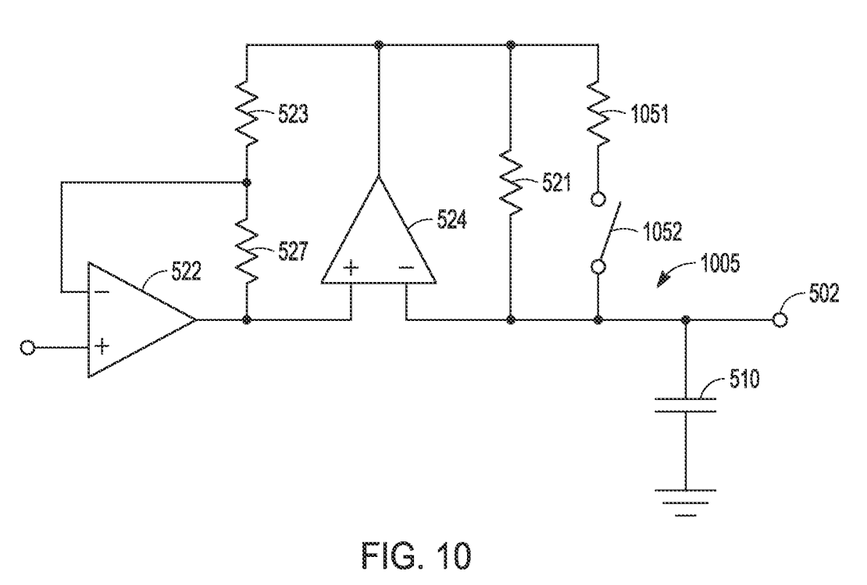
FIG. 10 shows an example impedance circuit structured to drive a capacitor at an output node, according to various embodiments.

As discussed herein, active circuits can be used to emulate an element of a driver circuit. In various embodiments, the emulated element is linear or time-invariant. In other embodiments, the emulated element can be non-linear or time-variant. For example, as shown in FIG. 9, the emulated element can be a non-linear slew boost such as provided by diodes 951 and 952 in parallel with resistor 521 in an embodiment of an example driver circuit 905 that is a modification of circuit 505. In another example, as shown in FIG. 10, impedance can be changed with time by the operation of switch 1052 and resistor 1051 to enhance settling of time or noise in an embodiment of an example driver circuit 1005 that is a modification of circuit 505. Other mechanisms for emulation may be used instead of Z-mode driver circuits or Y-mode driver circuits, including a combination of the two.

Figure 11:
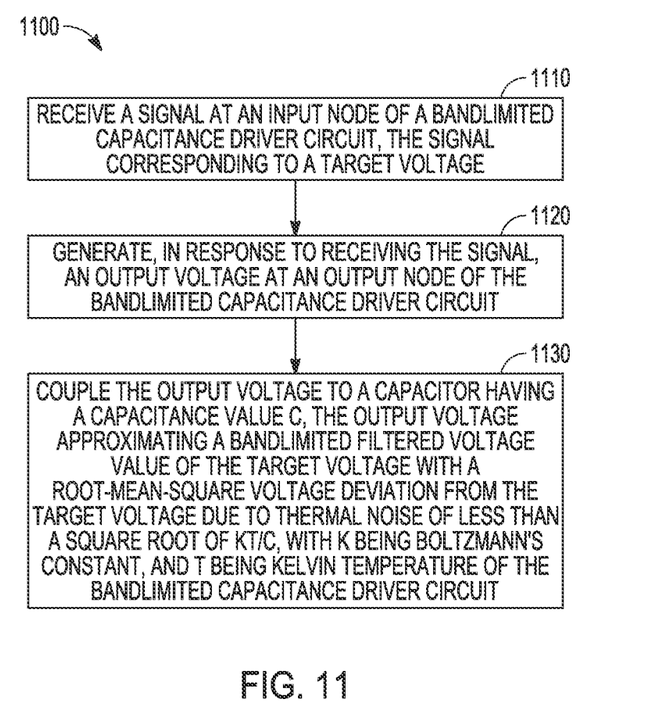
FIG. 11 is a flow diagram of example features of a method of operating a circuit having a capacitance driver circuit, according to various embodiments.

FIG. 11 is a flow diagram of an embodiment of example features of a method 1100 of operating a circuit having a capacitance driver circuit. At 1110, a signal is received at an input node of a bandlimited capacitance driver circuit, where the signal corresponds to a target voltage. At 1120, in response to receiving the signal, an output voltage is generated at an output node of the bandlimited capacitance driver circuit.

At 1130, the output voltage is coupled to a capacitor, where the capacitor has a capacitance value C. The output voltage is provided that approximates a bandlimited filtered voltage value of the target voltage with a root-mean-square voltage deviation from the target voltage due to thermal noise of less than a square root of kT/C, with k being Boltzmann's constant and T being Kelvin temperature of the bandlimited capacitance driver circuit.

Variations of method 1100 or methods similar to the method 1100 can include a number of different embodiments that may be combined depending on the application of such methods and/or the architecture of systems in which such methods are implemented. Such methods can include generating the output voltage at the output node to include measuring a voltage difference between the output voltage at the output node and a received voltage of the signal at the input node. Generating the output voltage at the output node can include measuring terminal current at the output node and generating the output voltage with the output voltage being different from the target voltage by an amount substantially equal to a response of an emulated system to the measured terminal current. The emulated system can be different and separate from the bandlimited capacitance driver circuit and the application circuit to which the bandlimited capacitance driver circuit is coupled to drive.

Variations of method 1100 or methods similar to the method 1100 can include approximating the bandlimited filtered voltage value of the target voltage using the capacitor as part of a filter associated with the bandlimited capacitance driver circuit. Variations can include coupling the output voltage to the capacitor to include coupling the output voltage to the capacitor with the capacitor coupled to a circuit disposed in a packaged integrated circuit, the packaged integrated circuit being different from the bandlimited capacitance driver circuit.

In various embodiments, a circuit can comprise a bandlimited capacitance driver circuit including an input node to receive a signal corresponding to a target voltage and an output node to couple to a capacitor having a capacitance value C. An output voltage, at the output node, can approximate a bandlimited filtered voltage value of the target voltage with a root-mean-square voltage deviation of the output voltage from the target voltage, due to thermal noise, being less than sqrt (kT/C).

Variations of such a circuit or similar circuits can include a number of different embodiments that may be combined depending on the application of such circuits and/or the architecture of systems in which such circuits are implemented. The circuit can include the bandlimited capacitance driver circuit being responsive to a voltage difference between the output voltage at the output node and a received voltage at the input node or responsive to a terminal current at the output node. The bandlimited capacitance driver circuit can include a measurement circuit to measure the voltage difference between the output voltage at the output node and the received voltage at the input node. The bandlimited capacitance driver circuit can be responsive to generate a current at the output node, with the current substantially being a response of an emulated system to the measured voltage difference. The emulated system can be a substantially linear and time-invariant system or a non-linear system.

Variations of such a circuit can include the bandlimited capacitance driver circuit structured to include a measurement circuit to measure the terminal current at the output node. The bandlimited capacitance driver circuit can be responsive to generate the output voltage at the output node with the output voltage being different from the target voltage by an amount substantially equal to a response of an emulated system to the measured terminal current. The emulated system can be separate from the bandlimited capacitance driver circuit.

Variations of such a circuit can include the bandlimited capacitance driver circuit having an active circuit, where the active circuit is an emulation of a resistance or an emulation of an inductor in series with or in parallel with a resistance. Variations can include the bandlimited capacitance driver circuit being a synthetic admittance circuit or a synthetic impedance circuit. Variations can include the bandlimited capacitance driver circuit integrated with an application circuit, with the output node coupled to the capacitor and to the application circuit. Variations can include the capacitor being a sampling capacitor of an ADC with the bandlimited capacitance driver circuit coupled to the capacitor.

In various embodiments, a circuit can comprise a means for driving a capacitance including an input node to receive a signal corresponding to a target voltage and an output node to couple to a capacitor having a capacitance value C. An output voltage, at the output node, can approximate a bandlimited filtered voltage value of the target voltage with a root-mean-square voltage deviation of the output voltage from the target voltage, due to thermal noise, being less than a square root of kT/C.

Variations of such a circuit or similar circuits can include a number of different embodiments that may be combined depending on the application of such circuits and/or the architecture of systems in which such circuits are implemented. The circuit can include a means for converting a format of the output voltage to a different format, with the output node being an input to the means for converting a format of the output voltage. Variations can include the means for driving a capacitance having a synthetic admittance circuit or a synthetic impedance circuit.

The following are example embodiments of capacitor circuits including capacitance driver circuits and associated methods, in accordance with the teachings herein. Architectures and methods implementing such capacitance driver circuits allow for addressing thermal noise. These circuits can include, but are not limited to, use with analog-to-digital converters.

An example circuit 1 can comprise: a bandlimited capacitance driver circuit including an input node to receive a signal corresponding to a target voltage and an output node to couple to a capacitor having a capacitance value C, with an output voltage, at the output node, approximating a bandlimited filtered voltage value of the target voltage with a root-mean-square voltage deviation from the target voltage due to thermal noise of less than a square root of kT/C, with k being Boltzmann's constant, and T being Kelvin temperature of the bandlimited capacitance driver circuit.

An example circuit 2 can include features of example circuit 1 and can include the bandlimited capacitance driver circuit being responsive to: a voltage difference between the output voltage at the output node and a received voltage at the input node; or a terminal current at the output node.

An example circuit 3 can include features of example circuit 2 or features of any of the preceding example circuits and can include the bandlimited capacitance driver circuit including a measurement circuit to measure the voltage difference between the output voltage at the output node and the received voltage at the input node.

An example circuit 4 can include features of example circuit 3 or features of any of the preceding example circuits and can include the bandlimited capacitance driver circuit being responsive to generate a current at the output node, the current substantially being a response of an emulated system to the measured voltage difference.

An example circuit 5 can include features of example circuit 4 or features of any of the preceding example circuits and can include the emulated system being a substantially linear and time-invariant system.

An example circuit 6 can include features of any of the preceding example circuits and can include the emulated system being a non-linear system.

An example circuit 7 can include features of example circuit 2 or features of any of the features of any of the preceding example circuits and can include the bandlimited capacitance driver circuit including a measurement circuit to measure the terminal current at the output node.

An example circuit 11 can include features of example circuit 7 or features of any of the preceding example circuits and can include the bandlimited capacitance driver circuit being responsive to generate the output voltage at the output node with the output voltage being different from the target voltage by an amount substantially equal to a response of an emulated system to the measured terminal current.

An example circuit 9 can include features of any of the preceding example circuits and can include the bandlimited capacitance driver circuit including an active circuit, the active circuit being an emulation of a resistance or an emulation of an inductor in series with or in parallel with a resistance.

An example circuit 10 can include features of any of the preceding example circuits and can include the bandlimited capacitance driver circuit being a synthetic admittance circuit or a synthetic impedance circuit.

An example circuit 11 can include features of any of the preceding example circuits and can include the bandlimited capacitance driver circuit being integrated with an application circuit, with the output node coupled to the capacitor and to the application circuit.

An example circuit 12 can include features of example circuit 10 or features of any of the preceding example circuits and can include the capacitor being a sampling capacitor of an analog-to-digital converter with the bandlimited capacitance driver circuit coupled to the capacitor.

An example circuit 13 can comprise: a means for driving a capacitance including an input node to receive a signal corresponding to a target voltage and an output node to couple to a capacitor having a capacitance value C, with an output voltage, at the output node, approximating a bandlimited filtered voltage value of the target voltage with a root-mean-square voltage deviation from the target voltage due to thermal noise of less than a square root of kT/C, with k being Boltzmann's constant, and T being Kelvin temperature of the bandlimited capacitance driver circuit.

An example circuit 14 can include features of example circuit 13 and can include a means for converting a format of the output voltage to a different format, with the output node being an input to the means for converting a format of the output voltage.

An example circuit 15 can include features of example circuits 13 and 14 and can include the means for driving a capacitance including a synthetic admittance circuit or a synthetic impedance circuit.

An example method 1 of operating a circuit having a capacitance driver circuit, the method comprising: receiving a signal at an input node of a bandlimited capacitance driver circuit, the signal corresponding to a target voltage; generating, in response to receiving the signal, an output voltage at an output node of the bandlimited capacitance driver circuit; and coupling the output voltage to a capacitor having a capacitance value C, the output voltage approximating a bandlimited filtered voltage value of the target voltage with a root-mean-square voltage deviation from the target voltage due to thermal noise of less than a square root of kT/C, with k being Boltzmann's constant, and T being Kelvin temperature of the bandlimited capacitance driver circuit.

An example method 2 of operating a circuit can include features of example method 1 and can include generating the output voltage at the output node to include measuring a voltage difference between the output voltage at the output node and a received voltage of the signal at the input node.

An example method 3 of operating a circuit can include features of example method 2 or features of any of the preceding example methods and can include generating the output voltage at the output node to include measuring terminal current at the output node and generating the output voltage with the output voltage being different from the target voltage by an amount substantially equal to a response of an emulated system to the measured terminal current.

An example method 4 of operating a circuit can include features of any of the preceding example methods and can include approximating the bandlimited filtered voltage value of the target voltage using the capacitor as part of a filter associated with the bandlimited capacitance driver circuit.

An example method 5 of operating a circuit can include features of any of the preceding example methods and can include coupling the output voltage to the capacitor to include coupling the output voltage to the capacitor with the capacitor coupled to a circuit disposed in a packaged integrated circuit, the packaged integrated circuit being different from the bandlimited capacitance driver circuit.

An example method 6 of operating a circuit can include features of any of the preceding example methods of operating a circuit and can include performing functions associated with any features of example circuits 1-15 and any features of example circuits associated with the figures herein.

The above detailed description refers to the accompanying drawings that show, by way of illustration and not limitation, various embodiments that can be practiced. These embodiments are described in sufficient detail to enable those skilled in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The above detailed description is, therefore, not to be taken in a limiting sense.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. A circuit comprising:
a bandlimited capacitance driver circuit including an input node to receive a signal corresponding to a target voltage and an output node to couple to a capacitor having a capacitance value C, with an output voltage, at the output node, approximating a bandlimited filtered voltage value of the target voltage with a root-mean-square voltage deviation from the target voltage due to thermal noise of less than a square root of $kT/C$, with k being Boltzmann's constant, and T being Kelvin temperature of the bandlimited capacitance driver circuit.

2. The circuit of claim 1, wherein the bandlimited capacitance driver circuit is responsive to:
a voltage difference between the output voltage at the output node and a received voltage at the input node; or
a terminal current at the output node.

3. The circuit of claim 2, wherein the bandlimited capacitance driver circuit includes a measurement circuit to measure the voltage difference between the output voltage at the output node and the received voltage at the input node.

4. The circuit of claim 3, wherein the bandlimited capacitance driver circuit is responsive to generate a current at the output node, the current substantially being a response of an emulated system to the measured voltage difference.

5. The circuit of claim 4, wherein the emulated system is a substantially linear and time-invariant system.

6. The circuit of claim 4, wherein the emulated system is a non-linear system.

7. The circuit of claim 2, wherein the bandlimited capacitance driver circuit includes a measurement circuit to measure the terminal current at the output node.

8. The circuit of claim 7, wherein the bandlimited capacitance driver circuit is responsive to generate the output voltage at the output node with the output voltage being different from the target voltage by an amount substantially equal to a response of an emulated system to the measured terminal current.

9. The circuit of claim 1, wherein the bandlimited capacitance driver circuit includes an active circuit, the active circuit being an emulation of a resistance or an emulation of an inductor in series with or in parallel with a resistance.

10. The circuit of claim 1, wherein the bandlimited capacitance driver circuit is a synthetic admittance circuit or a synthetic impedance circuit.

11. The circuit of claim 1, wherein the bandlimited capacitance driver circuit is integrated with an application circuit, with the output node coupled to the capacitor and to the application circuit.

12. The circuit of claim 1, wherein the capacitor is a sampling capacitor of an analog-to-digital converter with the bandlimited capacitance driver circuit coupled to the capacitor.

13. A method of operating a circuit having a capacitance driver circuit, the method comprising:
receiving a signal at an input node of a bandlimited capacitance driver circuit, the signal corresponding to a target voltage;
generating, in response to receiving the signal, an output voltage at an output node of the bandlimited capacitance driver circuit; and
coupling the output voltage to a capacitor having a capacitance value C, the output voltage approximating a bandlimited filtered voltage value of the target voltage with a root-mean-square voltage deviation from the target voltage due to thermal noise of less than a square root of $kT/C$, with k being Boltzmann's constant, and T being Kelvin temperature of the bandlimited capacitance driver circuit.

14. The method of claim 13, wherein generating the output voltage at the output node includes measuring a voltage difference between the output voltage at the output node and a received voltage of the signal at the input node.

15. The method of claim 13, wherein generating the output voltage at the output node includes measuring terminal current at the output node and generating the output voltage with the output voltage being different from the target voltage by an amount substantially equal to a response of an emulated system to the measured terminal current.

16. The method of claim 13, wherein the method includes approximating the bandlimited filtered voltage value of the target voltage using the capacitor as part of a filter associated with the bandlimited capacitance driver circuit.

17. The method of claim 13, wherein coupling the output voltage to the capacitor includes coupling the output voltage to the capacitor with the capacitor coupled to a circuit disposed in a packaged integrated circuit, the packaged integrated circuit being different from the bandlimited capacitance driver circuit.

18. A circuit comprising:
a means for driving a capacitance including an input node to receive a signal corresponding to a target voltage and an output node to couple to a capacitor having a capacitance value C, with an output voltage, at the output node, approximating a bandlimited filtered voltage value of the target voltage with a root-mean-square voltage deviation from the target voltage due to thermal noise of less than a square root of $kT/C$, with k being Boltzmann's constant, and T being Kelvin temperature of the bandlimited capacitance driver circuit.

19. The circuit of claim 18, wherein the circuit includes a means for converting a format of the output voltage to a different format, with the output node being an input to the means for converting a format of the output voltage.

20. The circuit of claim 18, wherein the means for driving a capacitance includes a synthetic admittance circuit or a synthetic impedance circuit.

\* \* \* \* \*